United States Patent
Hwang et al.

(10) Patent No.: US 12,557,449 B2
(45) Date of Patent: Feb. 17, 2026

(54) DISPLAY APPARATUS AND METHOD OF MANUFACTURING THE SAME

(71) Applicant: SAMSUNG ELECTRONICS CO., LTD., Suwon-si (KR)

(72) Inventors: Kyungwook Hwang, Seoul (KR); Junsik Hwang, Hwaseong-si (KR); Joonyong Park, Suwon-si (KR); Seogwoo Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1086 days.

(21) Appl. No.: 17/506,359

(22) Filed: Oct. 20, 2021

(65) Prior Publication Data

US 2022/0190223 A1    Jun. 16, 2022

Related U.S. Application Data

(60) Provisional application No. 63/125,621, filed on Dec. 15, 2020.

(30) Foreign Application Priority Data

Apr. 27, 2021    (KR) .................. 10-2021-0054629

(51) Int. Cl.
*H01L 33/62* (2010.01)
*H01L 25/16* (2023.01)
(Continued)

(52) U.S. Cl.
CPC ......... *H10H 20/857* (2025.01); *H01L 25/167* (2013.01); *H10H 20/01* (2025.01);
(Continued)

(58) Field of Classification Search
CPC .... H10H 20/857; H10H 20/01; H10H 20/841; H10H 20/0363; H10H 20/0364;
(Continued)

(56) References Cited

U.S. PATENT DOCUMENTS 7,727,788 B2    6/2010 Han et al.
2017/0133558 A1    5/2017 Sasaki et al.
(Continued)

FOREIGN PATENT DOCUMENTS

CN    110556395 A    12/2019
CN    111029360 A    4/2020
(Continued)

OTHER PUBLICATIONS

Communication issued May 10, 2022 by the European Patent Office in European Patent Application No. 21209021.1.
(Continued)

*Primary Examiner* — Ermias T Woldegeorgis
(74) *Attorney, Agent, or Firm* — Sughrue Mion, PLLC

(57) ABSTRACT

A display apparatus and a method of manufacturing the display method are provided. The display apparatus includes a transfer substrate, and micro display elements spaced apart from each other in units of sub-pixels on the transfer substrate, wherein each of the micro display elements includes a micro light emitting unit and a drive unit, wherein the drive unit includes drive electrodes and drives the micro light emitting unit.

13 Claims, 16 Drawing Sheets

(51) Int. Cl.
*H10H 20/01* (2025.01)
*H10H 20/841* (2025.01)
*H10H 20/857* (2025.01)

(52) U.S. Cl.
CPC ....... *H10H 20/841* (2025.01); *H10H 20/0363* (2025.01); *H10H 20/0364* (2025.01)

(58) Field of Classification Search
CPC ... H01L 25/167; H01L 25/50; A61K 40/4272; H10D 84/858
See application file for complete search history.

(56) References Cited

U.S. PATENT DOCUMENTS

| | | | |
|---|---|---|---|
| 2018/0226450 A1 | 8/2018 | Lai | |
| 2018/0315741 A1 | 11/2018 | Zhang | |
| 2019/0165035 A1 | 5/2019 | Fu | |
| 2019/0206313 A1* | 7/2019 | Xia | H10K 59/353 |
| 2019/0296184 A1 | 9/2019 | Ahmed et al. | |
| 2019/0334057 A1* | 10/2019 | Wang | H10H 20/018 |
| 2019/0371777 A1* | 12/2019 | Iguchi | H01L 25/18 |
| 2020/0175908 A1 | 6/2020 | Ahmed et al. | |
| 2020/0176516 A1 | 6/2020 | Yan et al. | |
| 2021/0407975 A1 | 12/2021 | Hu | |
| 2022/0013400 A1 | 1/2022 | Hwang et al. | |
| 2022/0093579 A1 | 3/2022 | Kishimoto | |

FOREIGN PATENT DOCUMENTS

| | | |
|---|---|---|
| EP | 3660900 A1 | 6/2020 |
| JP | 2003-115613 A | 4/2003 |
| KR | 10-0763894 B1 | 10/2007 |
| KR | 10-2014-0131466 A | 11/2014 |
| KR | 10-2022310 B1 | 9/2019 |
| WO | 2020157811 A1 | 8/2020 |

OTHER PUBLICATIONS

Communication issued Jun. 25, 2024 by the Korean Patent Office in Korean Application No. 10-2021-0054629.

Communication issued Mar. 20, 2025, by the China National Intellectual Property Administration in Chinese Application No. 202111477272.7.

* cited by examiner

DISPLAY APPARATUS AND METHOD OF MANUFACTURING THE SAME

CROSS-REFERENCE TO RELATED APPLICATIONS

This application is based on and claims priority under 35 U.S.C. § 119 to U.S. Provisional Application No. 63/125,621, filed on Dec. 15, 2020, in the United States Patent and Trademark Office, and Korean Patent Application No. 10-2021-0054629, filed on Apr. 27, 2021, in the Korean Intellectual Property Office, the disclosures of which are incorporated by reference herein in their entireties.

BACKGROUND

1. Field

Example embodiments relate to a micro light emitting element with increased luminous efficiency and a display apparatus including the micro light emitting element.

2. Description of Related Art

Liquid crystal displays (LCDs) and organic light emitting diode (OLED) displays are widely used as display apparatuses. Recently, a technology for manufacturing a high-resolution display apparatus by using a micro light emitting diode (LED) has been in the spotlight. In manufacturing a display apparatus including micro LED chips, a pick and place method is used as a method of transferring micro LEDs. However, when using this method, productivity is reduced as a size of a micro LED is reduced and a size of a display is increased.

A related art display apparatus includes a backplane substrate on which thin film transistors (TFTs) are integrated and to which organic light emitting diodes (OLEDs) and liquid crystal displays (LCDs) serving as light emitting elements are coupled. However, types of the TFTs that may be deposited are limited depending on the type and size of the backplane substrate, and thus, designs of the TFTs may be changed. Respective micro LEDs are transferred onto a TFT-formed substrate, and thus, the micro LEDs have the same limitation.

SUMMARY

One or more example embodiments provide a display apparatus including a micro display element.

One or more example embodiments also provide a method of manufacturing a display apparatus having a large area.

Additional aspects will be set forth in part in the description which follows and, in part, will be apparent from the description, or may be learned by practice of embodiments of the disclosure.

In accordance with an aspect of an example embodiment, a display apparatus including a transfer substrate; and micro display elements spaced apart from each other in units of sub-pixels on the transfer substrate, wherein each of the micro display elements includes a micro light emitting unit and a drive unit, wherein the drive unit includes drive electrodes and drives the micro light emitting unit, and wherein the drive unit faces the micro light emitting unit.

The drive unit may be monolithically coupled to the micro light emitting unit.

The drive unit and the micro light emitting unit may have a same width.

Each of the micro display elements may further include an insulating layer between the micro light emitting unit and the drive unit and divided in the units of the sub-pixels.

Each drive electrode from among the drive electrodes may be provided at a different distance from a center of the drive unit.

The drive unit may include a first quadrant, a second quadrant, a third quadrant, and a fourth quadrant that are partitioned by a first axis passing through a center of the drive unit and a second axis passing through the center of the drive unit perpendicular to the first axis, and the drive electrodes may be respectively provided in the first quadrant, the second quadrant, the third quadrant, and the fourth quadrant.

Each of the drive electrodes may be provided at a different distance from the center of the drive unit.

The drive electrodes may be symmetrically arranged with respect to a first axis passing through a center of the drive unit and a second axis passing through the center of the drive unit perpendicular to the first axis.

Each of the drive electrodes may include any one from among a concentric circle structure, a concentric quadrangular structure, a concentric hexagonal structure, a four-divided concentric circle structure, a four-divided concentric quadrangular structure, a four-divided concentric hexagonal structure, and a six-divided concentric hexagonal structure.

The drive unit may include two or more transistors and one or more capacitors.

The micro light emitting unit may include electrodes, and the micro light emitting unit may have a horizontal electrode structure in which the electrodes are arranged in one direction.

Each of the micro display elements may have an asymmetric structure, and the drive electrodes included in each of the micro display elements may be arranged side by side.

Each of the micro display elements may further include a reflective layer between the micro light emitting unit and the drive unit.

In accordance with an aspect of an example embodiment, a method of manufacturing a display apparatus includes forming a micro light emitting unit on a growth substrate; forming a drive unit over the micro light emitting unit, the drive unit including drive electrodes and being configured to drive the micro light emitting unit; removing the growth substrate; forming micro display elements by dividing the micro light emitting unit and the drive unit together in units of sub-pixels; and transferring the micro display elements onto a transfer substrate to be apart from each other.

The drive unit may be monolithically coupled to the micro light emitting unit.

The drive unit and the micro light emitting unit may have a same width.

The method may further include forming an insulating layer between the micro light emitting unit and the drive unit; and dividing the micro light emitting unit, the drive unit, and the insulating layer together in the units of the sub-pixels.

Each of the drive electrodes may be provided at a different distance from a center of the drive unit.

The drive unit may include a first quadrant, a second quadrant, a third quadrant, and a fourth quadrant that are partitioned by a first axis passing through a center of the drive unit and a second axis passing through the center of the drive unit perpendicular to the first axis, and the drive electrodes may be respectively provided in the first quadrant, the second quadrant, the third quadrant, and the fourth quadrant.

Each of the drive electrodes may be provided at a different distance from the center of the drive unit.

The drive electrodes may be symmetrically arranged with respect to a first axis passing through a center of the drive unit and a second axis passing through the center of the drive unit perpendicular to the first axis.

Each of the drive electrodes may include any one from among a concentric circle structure, a concentric quadrangular structure, a concentric hexagonal structure, a four-divided concentric circle structure, a four-divided concentric quadrangular structure, a four-divided concentric hexagonal structure, and a six-divided concentric hexagonal structure.

The drive unit may include two or more transistors and one or more capacitors.

The micro light emitting unit may include electrodes, and the micro light emitting unit may have a horizontal electrode structure in which the electrodes are arranged in one direction.

Each of the micro display elements may have an asymmetric structure, and the drive electrodes included in each of the micro display elements may be arranged side by side.

The display apparatus may further include a reflective layer between the micro light emitting unit and the drive unit.

The micro display elements may be transferred onto the transfer substrate by a fluidic self-assembly method.

In accordance with an aspect of the disclosure, a micro display element includes a micro light emitting unit; and a thin film transistor (TFT) drive unit monolithically formed on the micro light emitting unit.

The TFT drive unit may include drive electrodes on a side of the TFT drive unit facing away from the micro light emitting unit.

The drive electrodes may be concentrically arranged on the side of the TFT drive unit with at least one from among linear symmetry, point symmetry, and rotational symmetry.

The drive electrodes may be asymmetrically arranged on the side of the TFT.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
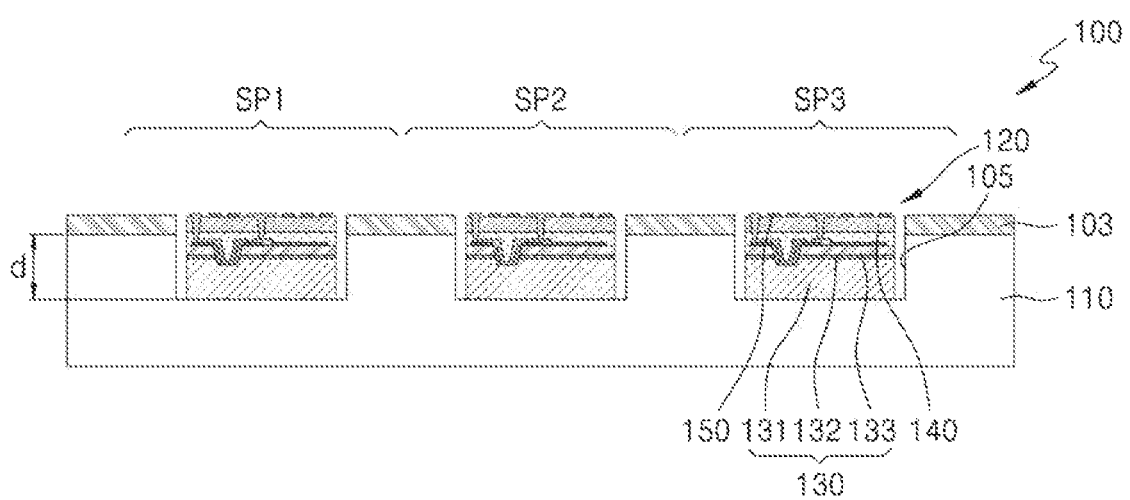
FIG. 1 is a schematic cross-sectional view of a display apparatus according to an example embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a display apparatus and a method of manufacturing the display apparatus according to various embodiments will be described in detail with reference to the accompanying drawings. In the drawings, like reference numerals refer to like elements, and a size of each element in the drawings may be exaggerated for clarity and convenience of description. The terms "first", "second", and so on may be used to describe various configuration elements but configuration elements should not be limited by terms. Terms are only used for the purpose of distinguishing one configuration element from another configuration element.

A singular expression includes plural expressions unless the context clearly indicates otherwise. In addition, when a part is described to "include" a certain configuration element, which means that the part may further include other configuration elements, except to exclude other configuration elements unless otherwise stated. In addition, in the drawings, a size or a thickness of each configuration element may be exaggerated for the sake of clear description. In addition, when it is described that a certain material layer is formed on a substrate or another layer, the material layer may also be formed in direct contact with the substrate or another layer, or a third layer may be formed therebetween. In addition, in the following examples, materials forming respective layers are examples, and other materials may be used.

In addition, terms such as "unit", "portion", and "module" described in the specification may indicate units that process at least one function or operation, which may be configured by hardware, software, or a combination of hardware and software.

Specific implementations described in the disclosure are examples and do not limit the technical scope in any way. For the sake of brief specification, descriptions of electronic configurations of the related art, control systems, software, and other functional aspects of the systems may be omitted. In addition, connection or connection members of lines between configuration elements illustrated in the drawings exemplarily represent functional connections and/or physical or circuit connections, and may be represented as alternative or additional various functional connections, physical connections, or circuit connections in an actual apparatus.

Use of a term "above-described" and a similar reference term may correspond to both the singular and the plural.

Steps constituting a method are not limited in the order described and may be performed in any suitable order unless there is a clear statement that the steps should be performed in the order described. In addition, use of all example terms ("for example" and "and so on") is merely for describing technical ideas in detail, and the scope of the claims are not limited to the terms unless limited by claims.

FIG. 1 illustrates a display apparatus according to an example embodiment.

A display apparatus 100 includes a plurality of pixels, and only one pixel is illustrated in FIG. 1 for the sake of convenience. The pixel may be a unit for displaying an image. Each of the pixels may include sub-pixels that emit light of different colors. An image may be displayed by the different colors from the sub-pixels by controlling the amount of light emitted by each sub-pixel. For example, each pixel may include a first sub-pixel SP1, a second sub-pixel SP2, and a third sub-pixel SP3.

The display apparatus 100 includes a transfer substrate 110 and micro display elements 120 arranged to be apart from each other in units of sub-pixels on the transfer substrate 110. The micro display elements 120 are transferred onto the transfer substrate 110, and the transfer substrate 110 may include a single layer or a plurality of layers. The transfer substrate 110 may have a single body or a single mold structure including a plurality of grooves 105. The transfer substrate 110 may include, for example, an organic material such as silicon, glass, sapphire, or polymer, an inorganic material, and/or a metal, and may be manufactured by photoresist patterning, etching, molding, and so on, but embodiments are not limited thereto. The grooves 105 may guide the micro display elements 120 when the micro display elements 120 are transferred onto the transfer substrate 110.

The grooves 105 may have cross-sectional areas that are wider than areas of the micro display elements 120 to accommodate the micro display elements 120. The grooves 105 may each have an area in which only one micro display element 120 may be placed or a plurality of micro display elements 120 may be placed. The grooves 105 may each have a shape similar to a cross-section of each of the micro display elements 120, for example, a circular cross-section or a polygonal cross-section. The grooves 105 may each have a depth d that is less than or greater than a thickness of each of the micro display elements 120, for example, a depth d less than twice the thickness of each of the micro display elements 120, or a depth d in a range of 0.5 to 1.5 times the thickness of each of the micro display elements 120. In addition, a bottom surface of each of the grooves 105 may have a roughness of about 50 nm or less.

A metal layer 103 may be further provided on a surface of the transfer substrate 110. The metal layer 103 may include Ag, Au, Pt, Ni, Cr, and/or Al, and may have a surface energy that is different from a surface energy of the transfer substrate 110. A polymer may be further coupled to the metal layer 103. A difference in surface energy not only enables the micro display element 120 to be transferred into the groove 105 well, but also enables the micro display element 120 that is not transferred into the groove 105 and remains on the surface of the transfer substrate 110 to be separated well from the transfer substrate 110 in a cleaning step. The metal layer 103 may be selected from among hydrophobic materials, and the groove 105 may be selected from among hydrophilic materials such that the metal layer 103 has a large difference in surface energy.

Figure 2:
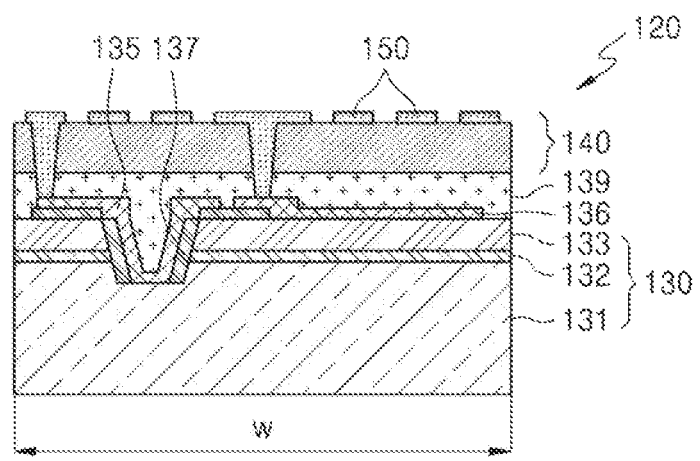
FIG. 2 illustrates a micro display element of a display apparatus according to an example embodiment.

FIG. 2 illustrates one of the micro display elements 120.

The micro display element 120 may include a micro light emitting unit 130 and a drive unit 140 that drives the micro light emitting unit 130. For example, the micro display element 120 may have a width (w) of 200 μm or less. The micro display element 120 may be used as a transfer element.

The drive unit 140 may be arranged to face the micro light emitting unit 130. The drive unit 140 may have a structure monolithically coupled to the micro light emitting unit 130. The monolithically coupled structure may be a structure in which the drive unit 140 is integrally coupled to the micro light emitting unit 130 without an adhesive layer. The micro display element 120 may be cut in units of sub-pixels in a state where the micro light emitting unit 130 is integrated with the drive unit 140, and the drive unit 140 may have the same width was the micro light emitting unit 130.

An insulating layer 139 may be between the micro light emitting unit 130 and the drive unit 140. The insulating layer 139 may be divided in units of sub-pixels together with the micro light emitting unit 130 and the drive unit 140. Accordingly, the insulating layer 139 may have the same width w as the micro light emitting unit 130 and the drive unit 140.

The drive unit 140 may include drive electrodes 150 for driving the micro light emitting unit 130. The drive electrodes 150 may supply current to the micro light emitting unit 130 and may be provided at positions corresponding to the micro light emitting unit 130. That is, the drive electrodes 150 may be provided in regions of the drive unit 140 corresponding to the micro light emitting unit 130 on a surface of the drive unit 140 facing away from the micro light emitting unit 130. The drive electrodes 150 may constitute a transistor, a capacitor, or so on. A layer including the drive unit 140 may include one of low temperature poly silicon, low temperature poly oxide, amorphous silicon (a-Si), and oxide.

The micro light emitting unit 130 may include a first semiconductor layer 131, a light emitting layer 132, and a second semiconductor layer 133 that are sequentially stacked. The first semiconductor layer 131 may include a first type semiconductor. For example, the first semiconductor layer 131 may include an n-type semiconductor. The first semiconductor layer 131 may include a group III-V-based n-type semiconductor, for example, n-GaN. The first semiconductor layer 131 may have a single-layer structure or a multi-layer structure.

The light emitting layer 132 may be provided on an upper surface of the first semiconductor layer 131. Electrons and holes in the light emitting layer 132 combine to emit light. The light emitting layer 132 may have a multi-quantum well (MQW) structure or a single quantum well (SQW) structure. The light emitting layer 132 may include a group III-V-based semiconductor, for example, GaN.

The second semiconductor layer 133 may be provided on an upper surface of the light emitting layer 132. The second semiconductor layer 133 may include, for example, a p-type semiconductor. The second semiconductor layer 133 may include a group III-V-based p-type semiconductor, for example, p-GaN. The second semiconductor layer 133 may have a single-layer structure or a multi-layer structure. Alternatively, when the first semiconductor layer 131 includes a p-type semiconductor, the second semiconductor layer 133 may include an n-type semiconductor.

A first electrode 135 electrically connected to the first semiconductor layer 131 may be provided, and a second electrode 136 electrically connected to the second semiconductor layer 133 may be provided. The first electrode 135 may include a pixel electrode, and the second electrode 136 may include a common electrode. When the first semiconductor layer 131 and the second semiconductor layer 133 respectively include an n-type semiconductor and a p-type semiconductor, the first electrode 135 and the second electrode 136 may respectively include an n-type electrode and a p-type electrode. The first electrode 135 may be connected to the first semiconductor layer 131 through a via-metal 137. The micro light emitting unit 130 may have a horizontal electrode structure in which electrodes are arranged in one direction.

The drive unit 140 may be electrically connected to the first electrode 135 and the second electrode 136, and the drive unit 140 may control on-off of power. Therefore, the drive unit 140 may selectively drive at least one desired sub-pixel among the first sub-pixel SP1, the second sub-pixel SP2, and the third sub-pixel SP3.

The first electrode 135 and the second electrode 136 may each include a reflective material to reflect light emitted from the light emitting layer 132. The first electrode 135 and the second electrode 136 may each include, for example, Ag, Au, Al, Cr or Ni, or an alloy thereof. Alternatively, the first electrode 135 and the second electrode 136 may be formed as transparent electrodes to transmit light emitted from the light emitting layer 132. The transparent electrode may include, for example, indium tin oxide (ITO), zinc oxide (ZnO), indium zinc oxide (IZO), or indium gallium zinc oxygen (IGZO).

The drive unit 140 may include a transistor, a thin film transistor, or a high electron mobility transistor (HEMT) for electrically driving the micro light emitting unit 130. The drive electrodes 150 may include, for example, a source electrode, a drain electrode, or a gate electrode constituting the transistor. Alternatively, the drive unit 140 may include a capacitor. The drive electrodes 150 may constitute a capacitor. The drive unit 140 may include, for example, two or more transistors and one or more capacitors but is not limited thereto. The two transistors may include a drive transistor for supplying a current to the micro light emitting unit 130 and a switching transistor functioning as a switch.

The drive electrodes 150 may be connected to the first electrode 135 and the second electrode 136 of the micro light emitting unit 130.

Figure 3:
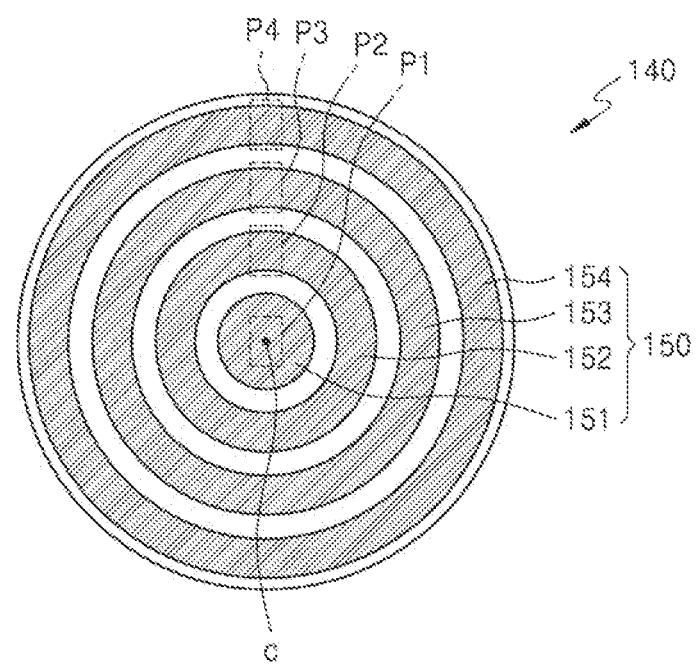
FIGS. 3 to 8 are views illustrating examples of drive electrodes included in a drive unit of a display apparatus according to an example embodiment.

FIG. 3 is a plan view of drive electrodes 150 of the drive unit 140. The drive electrodes 150 may be provided at different radial positions or different distances from the center c of the drive unit 140. The drive electrodes 150 may include a first drive electrode 151 provided at the center c of the drive unit 140, and may further include a second drive electrode 152, a third drive electrode 153, and a fourth drive electrode 154 of a closed-loop type provided around the first drive electrode 151. Here, the drive electrodes 150 may include only the second drive electrode 152, the third drive electrode 153, and the fourth drive electrode 154 of the closed-loop type without the first drive electrode 151. As illustrated in FIG. 3, the drive electrodes 150 may have a symmetrical structure. For example, the drive electrodes 150 may have a linearly symmetrical structure, a point symmetrical structure, or a rotationally symmetrical structure but are not limited thereto.

FIG. 3 illustrates an example in which the drive electrodes 150 have a concentric circle structure. The drive electrodes 150 may include a first drive electrode 151 provided at the center c of the drive unit 140, and may further include a second drive electrode 152, a third drive electrode 153, and a fourth drive electrode 154 of a closed-loop type provided around the first drive electrode 151. In a case where the drive electrodes 150 are configured in this way, when the micro display element 120 is transferred onto the transfer substrate 110, electrode pads may be connected to the drive electrodes 150 regardless of a transfer direction of the micro display element 120. For example, when the drive electrodes 150 include the first drive electrode 151, the second drive electrode 152, the third drive electrode 153, and the fourth drive electrode 154 and a first electrode pad P1, a second electrode pad P2, a third electrode pad P3, and a fourth electrode pad P4 are provided, the first drive electrode 151 may be connected to the first electrode pad P1, the second drive electrode 152 may be connected to the second electrode pad P2, the third drive electrode 153 may be connected to the third electrode pad P3, and the fourth drive electrode 154 may be connected to the fourth electrode pad P4. When the drive electrodes 150 have a concentric circle structure, no matter which direction the micro display element 120 is transferred onto the transfer substrate 110, the first drive electrode 151, the second drive electrode 152, the third drive electrode 153, and the fourth drive electrode 154 may be respectively connected to the first, second, third, and fourth electrode pads P1, P2, P3, and P4 corresponding thereto. As such, the drive electrodes 150 may be connected to corresponding electrode pads regardless of a transfer direction of the micro display element 120.

Figure 4:
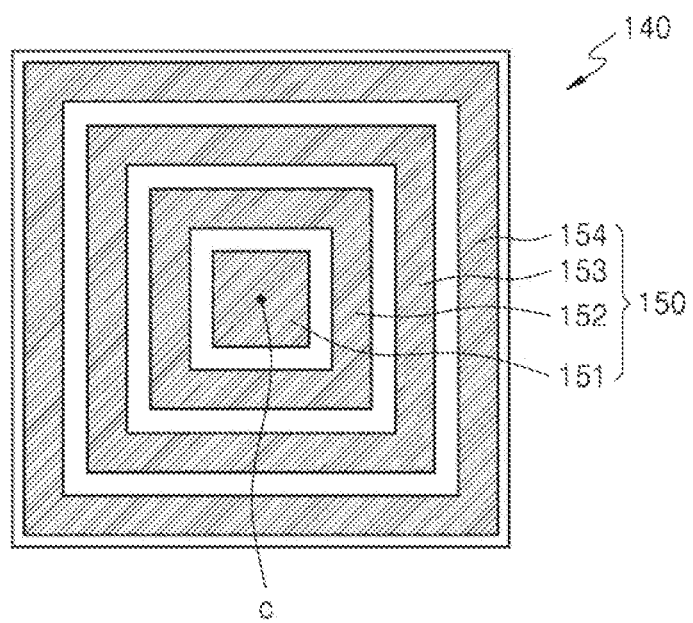

FIG. 4 illustrates an example of the drive electrodes of the drive unit. The drive electrodes 150 may have a concentric quadrangular structure. The concentric quadrangular structure may include a quadrangular first drive electrode 151 provided at the center c of the drive unit 140, and may further include the second drive electrode 152, the third drive electrode 153, and the fourth drive electrode 154 each having a shape of a quadrangular ring provided around the first drive electrode 151.

Figure 5:
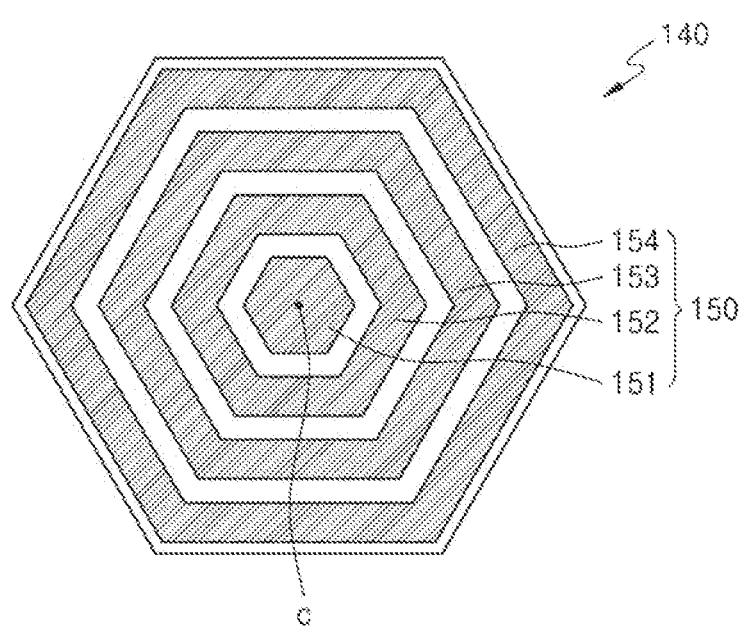

FIG. 5 illustrates an example of the drive electrodes of the drive unit. The drive electrodes 150 may have a concentric hexagonal structure. The concentric hexagonal structure may include a hexagonal first drive electrode 151 provided at the center c of the drive unit 140, and may further include the second drive electrode 152, the third drive electrode 153, and the fourth drive electrode 154 each having a shape of a hexagonal ring provided around the first drive electrode 151.

Figure 6:
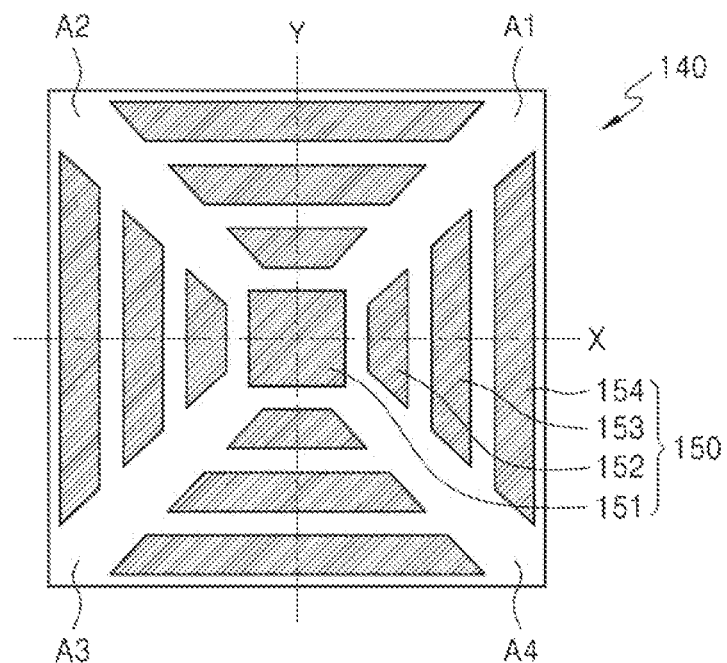

FIG. 6 illustrates an example of the drive electrodes of the drive unit. The drive electrodes 150 may have a four-divided concentric quadrangular structure. Here, the four divisions are not limited to an equal division. The drive unit 140 may include a first quadrant A1, a second quadrant A2, a third quadrant A3, and a fourth quadrant A4 partitioned by a first axis X and a second axis Y perpendicularly passing through the center c. The first drive electrode 151, the second drive electrode 152, the third drive electrode 153, and the fourth drive electrode 154 may be respectively provided in all of the first quadrant A1, the second quadrant A2, the third quadrant A3, and the fourth quadrant A4. Each of the quadrants may include a pair of the second drive electrode 152, the third drive electrode 153, and the fourth drive electrode 154 or two pairs of the second drive electrode 152, the third drive electrode 153, and the fourth drive electrode 154. The drive electrodes 150 may be symmetrically arranged with respect to the first axis X and the second axis Y.

Figure 7:
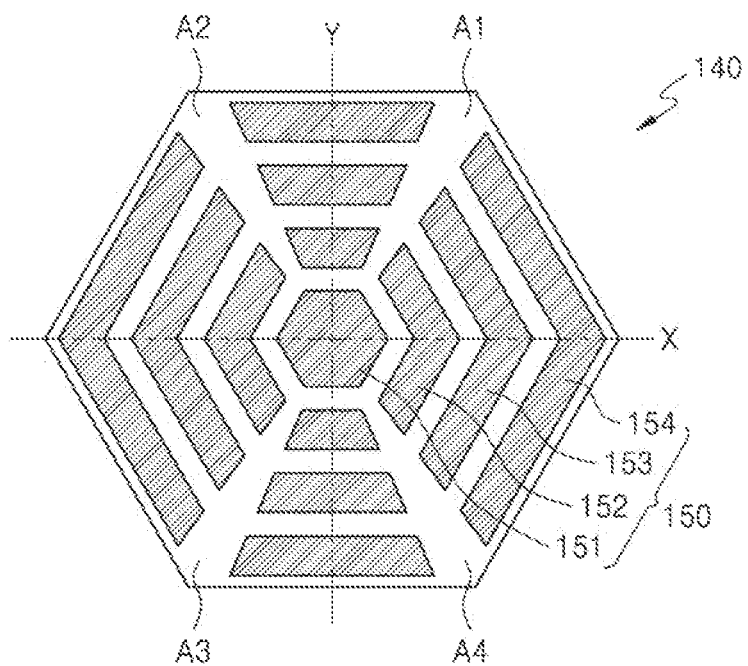

FIG. 7 illustrates an example of the drive electrodes of the drive unit. The drive electrodes 150 may have a four-divided concentric hexagonal structure. Here, the four divisions are not limited to an equal division. FIG. 7 illustrates an example in which the concentric hexagonal structure is divided into four portions but may be divided into six portions. The drive unit 140 may include a first quadrant A1, a second quadrant A2, a third quadrant A3, and a fourth quadrant A4 partitioned by a first axis X and a second axis Y perpendicularly passing through a center c. Each of the drive electrodes 150 may be provided in each of the first quadrant A1, the second quadrant A2, the third quadrant A3, and the fourth quadrant A4. Each of the quadrants may include a pair of the drive electrodes 150 or two pairs of the drive electrodes 150. The drive electrodes 150 may be symmetrically arranged with respect to the first axis X and the second axis Y. The drive electrodes 150 may include the first drive electrode 151, the second drive electrode 152, the third drive electrode 153, and the fourth drive electrode 154, and the first drive electrode 151, the second drive electrode 152, the third drive electrode 153, and the fourth drive electrode 154 need not have the same shape.

Figure 8:
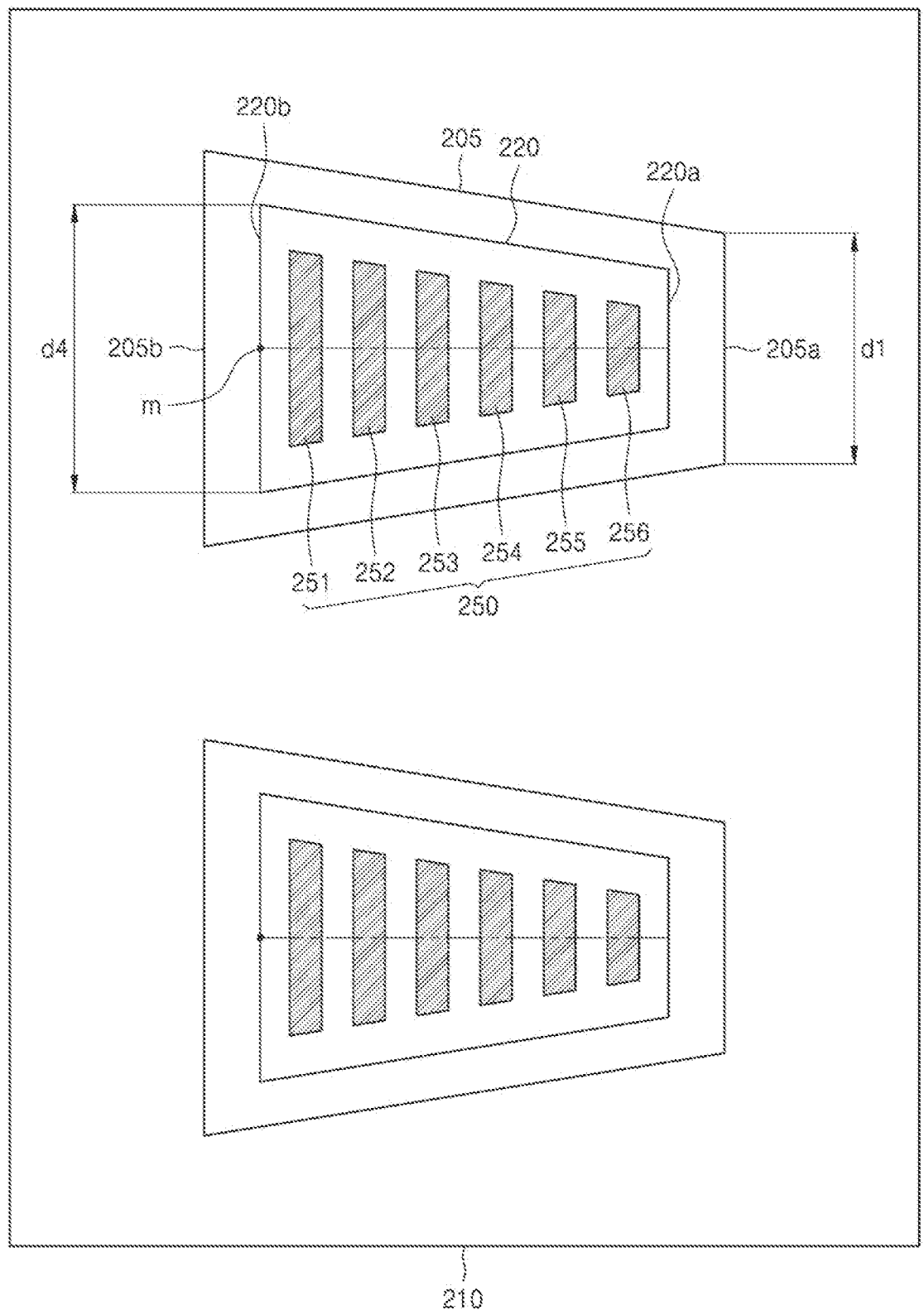

FIG. 8 illustrates an example of the drive electrodes of the drive unit. In an embodiment, a micro display element 220 may have an asymmetric structure, and drive electrodes 250 may be arranged side by side. A transfer substrate 210 may include a plurality of grooves 205, and the plurality of grooves 205 may have an asymmetric structure. A shape of the groove 205 may correspond to a shape of the micro display element 220. For example, the micro display element 220 and the groove 205 may have a trapezoidal shape. The groove 205 may have a first side 205a and a second side 205b that face each other, and the micro display element 220 may have a third side 220a and a fourth side 220b that face each other. A length d4 of the fourth side 220b may be greater than a length dl of the first side 205a such that the micro display element 220 may be transferred into the groove 205 with a certain directionality. Therefore, the micro display element 220 may be transferred to correspond to the shape of the groove 205. In addition, the drive electrodes 250 may be arranged with directionality. For example, when the drive electrodes 250 include a first drive electrode 251, a second drive electrode 252, a third drive electrode 253, a fourth drive electrode 254, a fifth drive electrode 255, and a sixth drive electrode 256, the first drive electrode 251, the second drive electrode 252, the third drive electrode 253, the fourth drive electrode 254, the fifth drive electrode 255, and the sixth drive electrode 256 may be arranged side by side at different distances from any one point m of the drive unit. When the drive electrodes are arranged in this way, the first drive electrode 251, the second drive electrode 252, the third drive electrode 253, the fourth drive electrode 254, the fifth drive electrode 255, and the sixth drive electrode 256 may be respectively connected to electrode pads corresponding thereto. According to an embodiment, when it is difficult to secure an area because the required number of electrodes is large compared to a size of a micro display element, an area of the electrode may be reduced and an error rate of connection to an electrode pad may be reduced.

Figure 9:
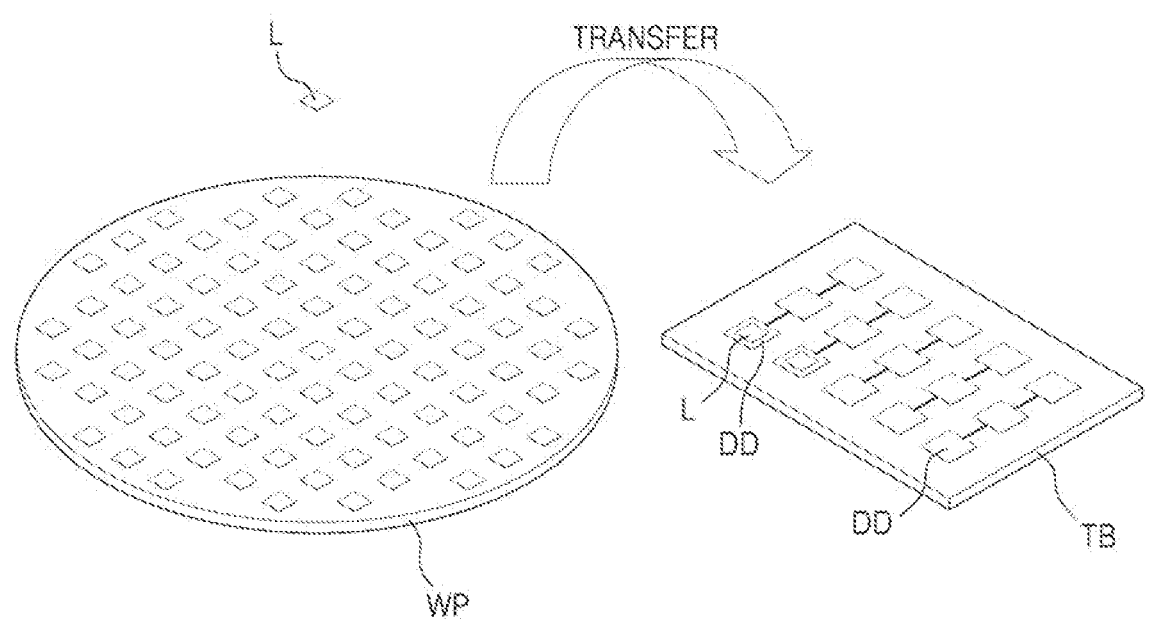
FIG. 9 illustrates a comparative example of a transfer method of a display apparatus.

The display apparatuses according to various embodiments described above may be manufactured by transferring micro display elements to transfer substrates. FIG. 9 illustrates a comparative example in which light emitting units L are formed on a wafer WP and are separated from the wafer WP to be transferred onto a transfer substrate TB. In the comparative example, drive units DD for driving the light emitting units L are formed on the transfer substrate TB. The separated light emitting units L may be transferred onto the transfer substrate TB to be coupled to the drive units DD. As such, when the drive units DD are provided in the transfer substrate TB, there are restrictions on a type and a material of the transfer substrate TB.

Figure 10:
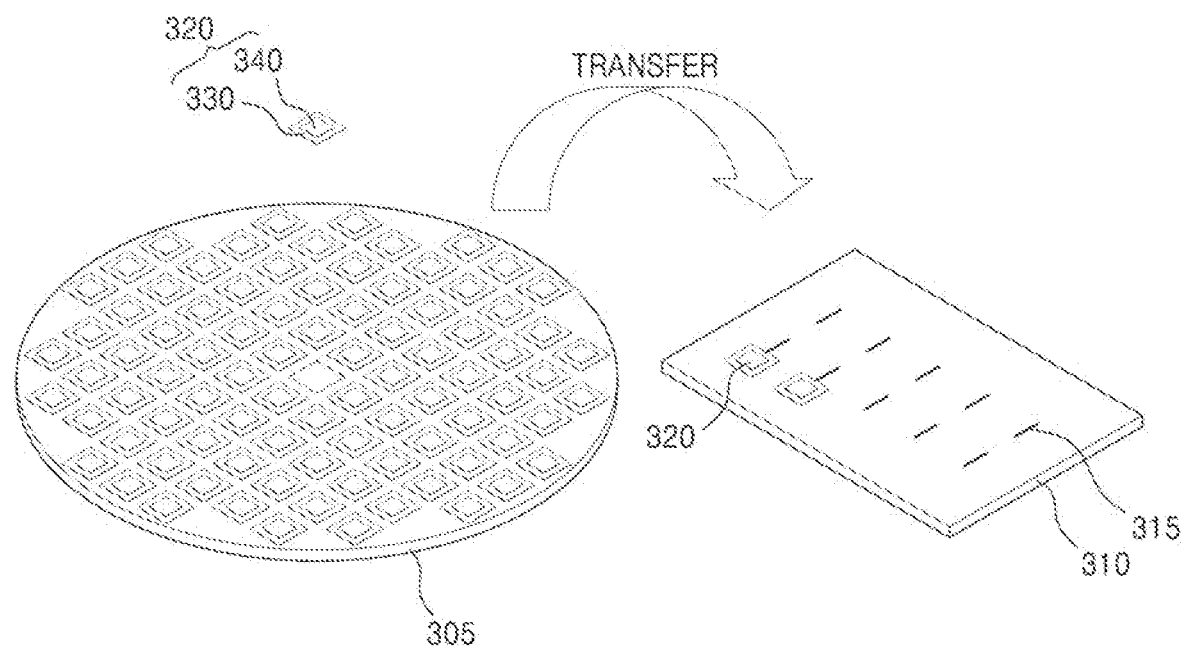
FIG. 10 illustrates a transfer method of a display apparatus according to an example embodiment.

FIG. 10 is a view illustrating an example in which a micro display element is transferred onto a transfer substrate according to an example embodiment. A micro display element 320 includes both of a micro light emitting unit 330 grown on a wafer (growth substrate) 305 and a drive unit 340 monolithically integrated in the micro light emitting unit 330. The micro display element 320 is divided in units of individual chips and transferred onto the transfer substrate 310. Wiring lines 315 may be formed on the transfer substrate 310. Only wiring lines are formed on the transfer substrate 310, and thus, there may be no restriction on a type and a material of the transfer substrate 310.

As illustrated in FIG. 9, when the micro light emitting unit formed on a wafer is moved onto the transfer substrate TB on which thin film transistors (TFTs) are formed, types of the TFTs may be limited by the transfer substrate TB. In contrast to this, as illustrated in FIG. 10, when a micro display element in which the drive unit 340 including the TFT is monolithically integrated in the micro light emitting unit 330 to be diced is transferred onto the transfer substrate 310, substrate selection for forming the TFT is no longer limited, and thus, displays may be formed on various substrates. When TFTs are formed by a low temperature poly-silicon (LTPS) process on a general wafer where micro light emitting diodes (LEDs) are formed, many restrictions on TFT selection may be reduced. A micro display element in which a micro LED and a TFT are combined may be effectively transferred onto a large-area substrate by using a fluidic self-assembly method.

Figure 11:
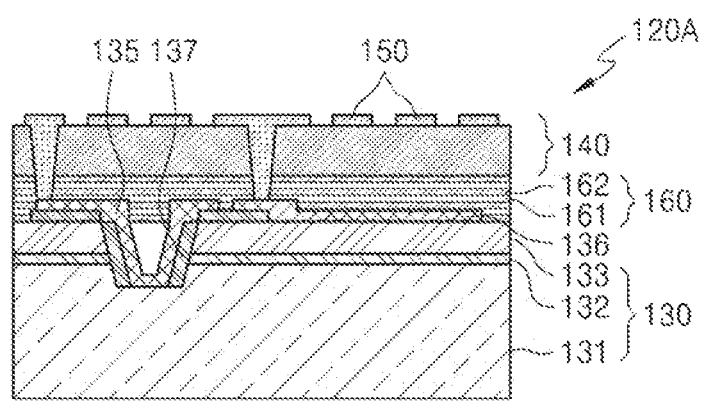
FIG. 11 illustrates an example of a micro display element of a display apparatus according to an example embodiment.

FIG. 11 illustrates an example in which a reflective layer is further provided in the micro display element illustrated in FIG. 2. Components of FIG. 11 having the same reference numerals as the components of FIG. 2 have substantially the same functions and configurations as described with reference to FIG. 2, and thus, detailed descriptions thereof are omitted.

A micro display element 120A may further include a reflective layer 160 between the micro light emitting unit 130 and the drive unit 140. The reflective layer 160 may be, for example, a distributed Bragg reflective layer. The reflective layer 160 may include a first layer 161 and a second layer 162, which have different refractive indices and are alternately stacked a plurality of times. Due to a difference in refractive index, all waves reflected from interfaces of respective layers may interfere with each other. The distributed Bragg reflective layer 160 may have a structure in which layers including two of, for example, Si, $Si_3N_4$, $SiO_2$, $TiO_2$, $Ta_2O_5$, and $ZrO_2$ are alternately stacked. The distributed Bragg reflective layer 160 may have a structure in which, for example, an $SiO_2$ layer and a $TiO_2$ layer are alternately stacked. Light reflectivity may be adjusted by thicknesses of two layers of the reflective layer 160 and the number of stacks thereof. The reflective layer 160 may reflect light emitted from the micro light emitting unit 130 to be emitted in a downward direction as shown in FIG. 11.

Figure 12:
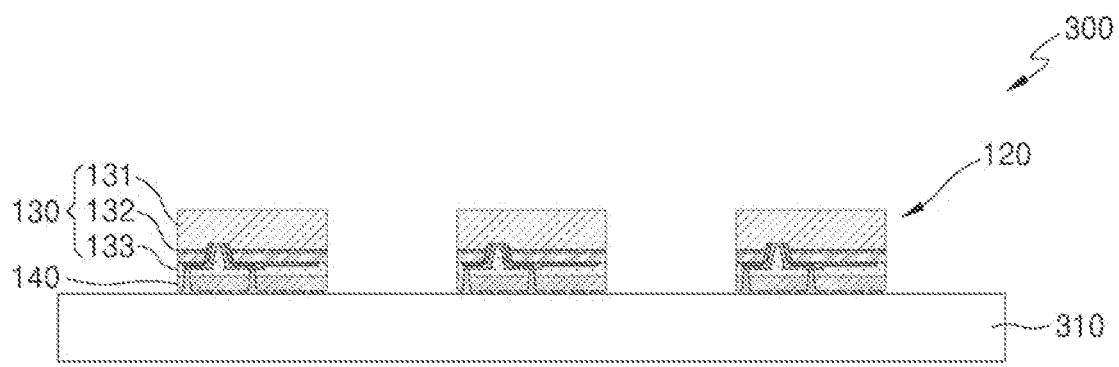
FIG. 12 illustrates a display apparatus according to an example embodiment.

FIG. 12 illustrates a display apparatus according to an example embodiment. The display apparatus 300 may include the transfer substrate 310 and the micro display element 120 provided to be apart from the transfer substrate 310. The micro display element 120 is substantially the same as the micro display element described with reference to FIG. 2, and thus, detailed descriptions thereof are omitted. The transfer substrate 310 may be a flat substrate and may be arranged such that the drive unit 140 faces the transfer substrate 310. The micro display element 120 may be bonded to the transfer substrate 310.

Figure 13:
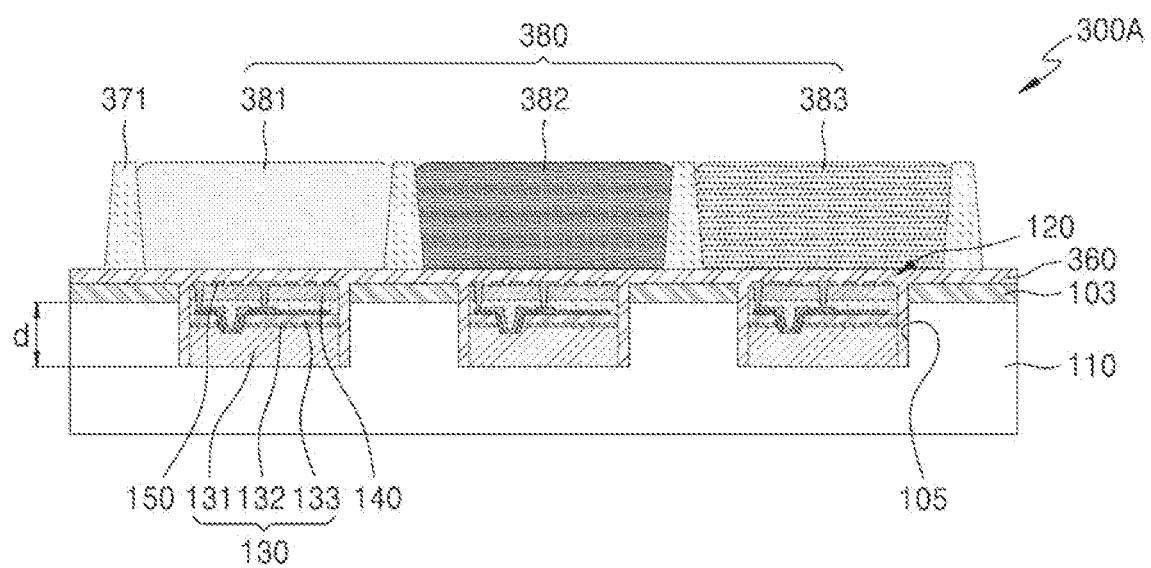
FIG. 13 illustrates an example in which a color conversion layer is further provided in the display apparatus illustrated in FIG. 1.

FIG. 13 illustrates an example in which a color conversion layer is further provided in the display apparatus described with reference to FIGS. 1 and 2. Components of FIG. 13 having the same reference numbers as the components of FIGS. 1 and 2 have substantially the same functions and configurations as described with reference to FIGS. 1 and 2, and thus, detailed descriptions thereof are omitted.

A display apparatus 300A may include partition walls 371 separated from each other at sub-pixel intervals, and color conversion layers 380 provided between adjacent partition walls 371. The color conversion layers 380 may each convert a color of light emitted from the micro light emitting unit 130. The micro light emitting unit 130 may emit first color light, for example, blue light. However, this is only an example, and light having another wavelength capable of exciting the color conversion layers may also be emitted. A planarization layer 360 may be further provided between the drive unit 140 and the color conversion layers 380.

The color conversion layers 380 include a first color conversion layer 381 that converts light from the micro light emitting unit 130 into first color light, a second color conversion layer 382 that converts the light into second color light, and a third color conversion layer 383 that convers light into third color light. The second color light may be, for example, green light, and the third color light may be, for example, red light.

When the micro light emitting unit 130 emits blue light, the first color conversion layer 381 may include a resin that transmits blue light without light conversion. The second color conversion layer 382 may convert blue light emitted from the micro light emitting unit 130 to emit green light. The second color conversion layer 382 may include quantum dots that are excited by blue light to emit green light, and each of the quantum dots may have a core-shell structure including a core portion and a shell portion or may have a particle structure without a shell. The core-shell structure may be a single-shell structure or a multi-shell structure, such as a double-shell structure.

Each of the quantum dots may include a group II-VI-based semiconductor, a group III-V-based semiconductor, a group IV-VI-based semiconductor, a group IV-based semiconductor, and/or a graphene quantum dot. The quantum dots may include, for example, Cd, Se, Zn, S, and/or InP, and each of the quantum dots may have a diameter of several tens of nm or less, for example, a diameter of about 10 nm or less.

The second color conversion layer 382 may also include a phosphor that is excited by blue light emitted from the micro light emitting unit 130 to emit green light.

The third color conversion layer 383 may convert the blue light emitted from the micro light emitting unit 130 into red light and emit the red light. The third color conversion layer 383 may include quantum dots of a certain size that are excited by blue light to emit red light or may include a phosphor that is excited by the blue light emitted from the micro light emitting unit 130 to emit red light.

Figure 14:
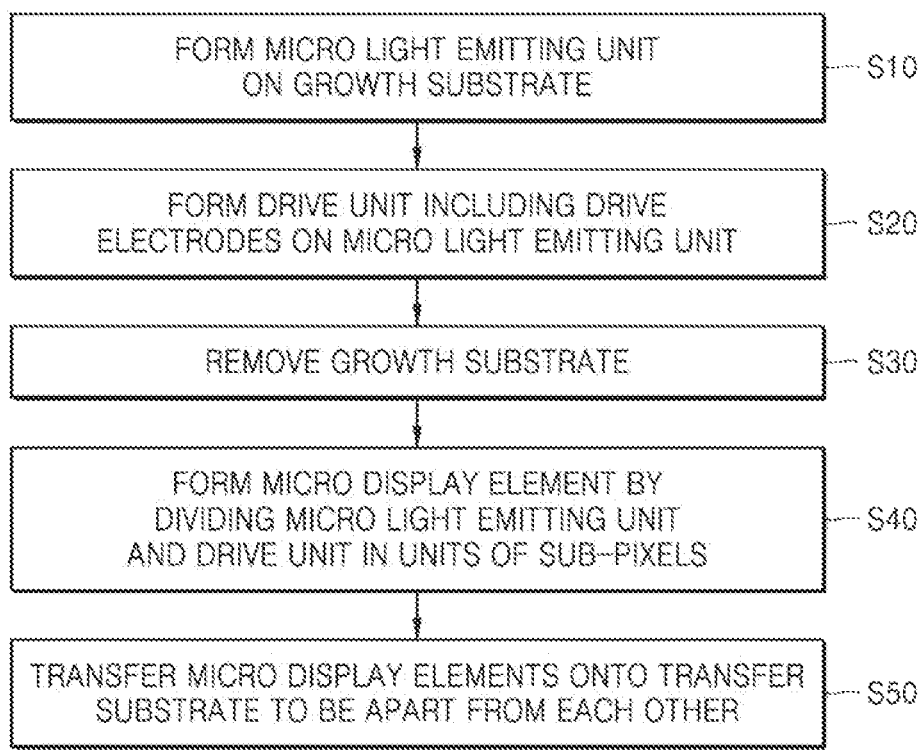
FIG. 14 is a flowchart illustrating a method of manufacturing a display apparatus according to an example embodiment.

FIG. 14 is a flowchart illustrating a method of manufacturing a display apparatus according to an example embodiment.

Figure 15:
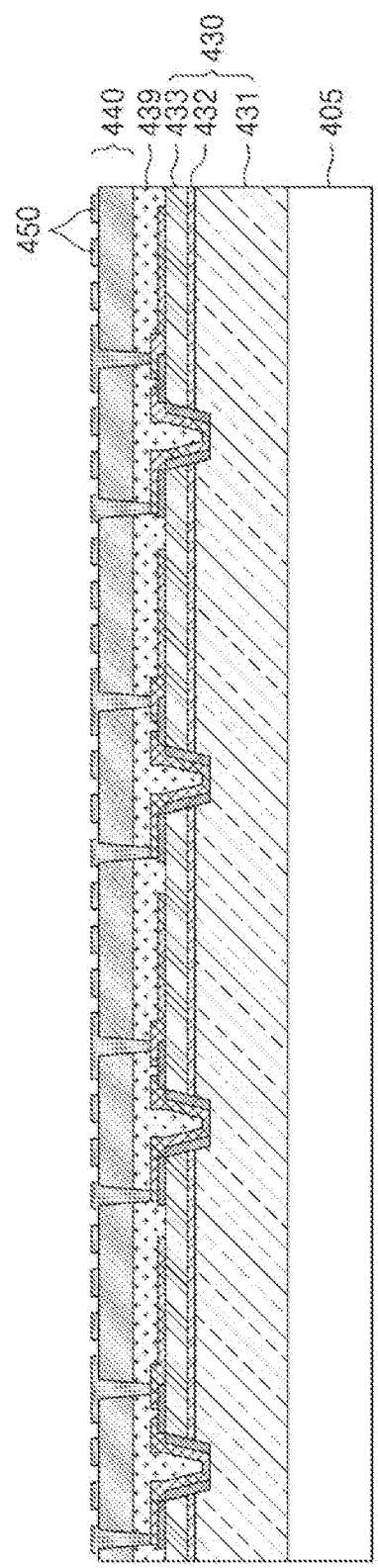
FIG. 15 illustrates a micro light emitting unit and a drive unit formed on a growth substrate by using a method of manufacturing a display apparatus according to an example embodiment.

Referring to FIGS. 14 and 15, the method of manufacturing a display apparatus includes a step of forming a micro light emitting unit 430 on a growth substrate 405 (S10), and a step of forming a drive unit 440, which includes drive electrodes 450 and drives the micro light emitting unit 430, on the micro light emitting unit 430 (S20). The micro light emitting unit 430 includes a first semiconductor layer 431 formed on the growth substrate 405, a light emitting layer 432 formed on the first semiconductor layer 431, and a second semiconductor layer 433 formed on the light emitting layer 432. The first semiconductor layer 431, the light emitting layer 432, and the second semiconductor layer 433 may be integrally formed over the entire pixel region without being divided into units of sub-pixels. The drive unit 440 may be monolithically formed on the second semiconductor layer 433. The drive electrodes 450 of the drive unit 440 may each have the same structure as described with reference to FIGS. 3 to 8. An insulating layer 439 may be formed between the second semiconductor layer 433 and the drive unit 440.

Figure 16:
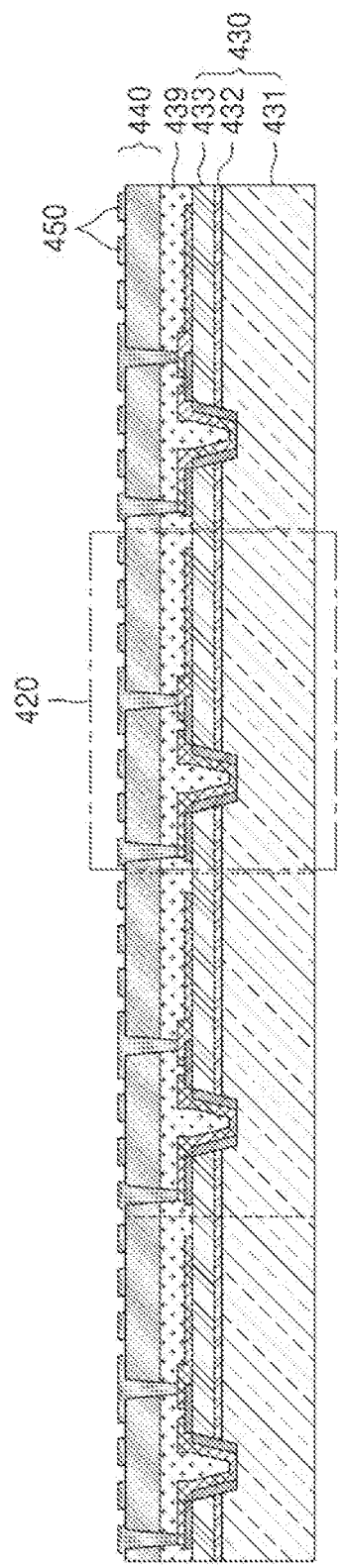
FIG. 16 illustrates micro display elements formed by removing the growth substrate from the structure illustrated in FIG. 15.

Referring to FIGS. 14 and 16, the growth substrate 405 is removed from the first semiconductor layer 431 (S30), and the micro light emitting unit 430 and the drive unit 440 are divided together in units of sub-pixels to form the micro display elements 420 (S40). In a state in which the micro light emitting unit 430 is integrated with the drive unit 440, the micro light emitting unit 430 and the drive unit 440 are separated by cutting in units of sub-pixels or by using an etching process, and thus, a micro display element 420 is formed.

Figure 17:
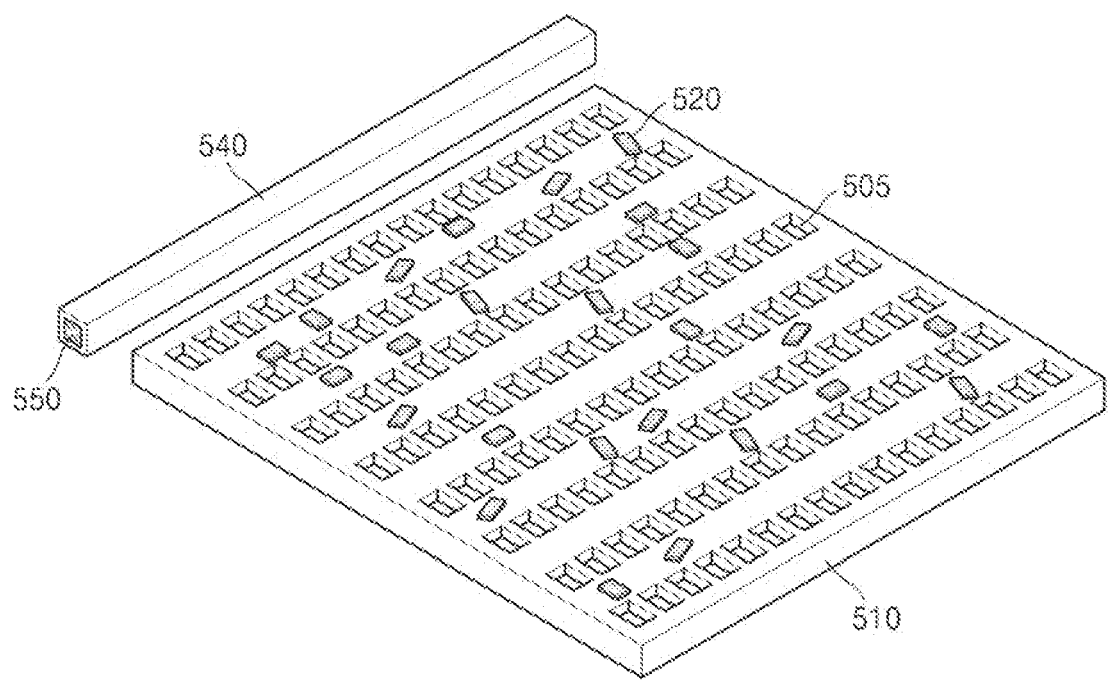
FIG. 17 illustrates transferring a micro display element onto a transfer substrate in a method of manufacturing a display apparatus according to an example embodiment.

Referring to FIGS. 14 and 17, micro display elements 520 are transferred onto a transfer substrate 510 (S50). The transfer substrate 510 includes a plurality of grooves 505 in which the micro display elements 520 are arranged. A liquid may be supplied to the grooves 505 to transfer the micro display elements 520 to the grooves 505. Any kind of liquid may be used as long as the liquid does not corrode or damage the micro display elements 520. The liquid may include, for example, one or a combination of a plurality of groups, each group including, for example, water, ethanol, alcohol, polyol, ketone, halocarbon, acetone, flux, and organic solvent. The organic solvent may include, for example, isopropyl alcohol (IPA). A usable liquid is not limited thereto, and various modifications may be made.

A method of supplying a liquid to the grooves 505 may include various methods such as a spray method, a dispensing method, an inkjet dot method, and a method of flowing the liquid to the transfer substrate 510. The amount of liquid that is supplied to the grooves 505 may be adjusted to fit or overflow the grooves 505.

A plurality of micro display elements 520 may be supplied to the transfer substrate 510. The micro display elements 520 may be directly sprayed onto the transfer substrate 510 without other liquids or may be supplied in a state of being included in a suspension. A method of supplying the micro display elements 520 included in the suspension may include various methods such as a spray method, a dispensing method for dropping a liquid, an inkjet dot method for discharging a liquid like a printing method, and a method for flowing the suspension onto the transfer substrate 510. In addition, the transfer substrate 510 may be scanned by an absorbent member 540 capable of absorbing a liquid. The absorbent member 540 may be any material as long as the material is capable of absorbing a liquid, and its shape or structure is not limited. The absorbent member 540 may include, for example, fabric, tissue, polyester fiber, paper, or a wiper. The absorbent member 540 may be used alone without other auxiliary tools and may be coupled to a support 550 for convenient scanning of the transfer substrate 510 without being limited thereto. The support 550 may have various shapes and structures suitable for scanning the transfer substrate 510. The support 550 may have a shape of, for example, a rod, a blade, a plate, or a wiper. The absorbent member 540 may be provided on one side of the support 550 or may surround the support 550.

The absorbent member 540 may scan the transfer substrate 510 while pressing the transfer substrate 510 with an appropriate pressure. Scanning may include a step in which the absorbent member 540 passes over the plurality of grooves 505 to absorb a liquid while being in contact with the transfer substrate 510. The scanning may be performed in various methods such as a sliding method, a rotating method, a translating method, a reciprocating method, a rolling method, a spinning method, and/or a rubbing method of the absorbent member 540 and may include both a regular method and an irregular method. The scanning may also be performed by moving the transfer substrate 510 instead of moving the absorbent member 540, and scanning of the transfer substrate 510 may be performed by the sliding method, the rotating method, the translating method, the reciprocating method, the rolling method, the spinning method, and/or the rubbing method. The scanning may also be performed by cooperation of the absorbent member 540 and the transfer substrate 510. In this way, the micro display elements 520 may be transferred onto the transfer substrate 510 by using a fluidic self-assembly method. According to a display manufacturing method of an example embodiment, each of the drive electrodes 450 shown, e.g., in FIG. 16 has one of the structures illustrated in FIGS. 3 to 8, and thus, the micro display elements 520 may be connected to electrode pads of wiring lines no matter in which direction the micro display elements 520 are transferred.

An example method of manufacturing a display apparatus may include a method of forming metal lines in micro display elements to electrically connect the transferred micro display elements to each other, or a method of bonding and transferring micro display elements to a transfer substrate on which metal lines are formed. As described above, a micro light emitting element including both of a drive unit and a micro light emitting unit monolithically coupled to each other is transferred onto a transfer substrate, and thus, a structure, a material, a process, and so on of the transfer substrate may be freely selected without various restrictions in a case where the drive unit including a TFT and so on is formed on the transfer substrate. For example, the transfer substrate 510 may include various materials such as glass, silicon, and polymer.

A backplane substrate including TFTs, capacitors, and so on is diversified in usage and material to be applied to various elements. However, when the backplane substrate is manufactured by using the LTPS process, the backplane substrate is difficult to be manufactured in a large area. Because vacuum deposition equipment is costly, it costs a lot to form TFTs on a large-area backplane substrate, and it is difficult to ensure uniformity of the large-area backplane substrate. In addition, a high-temperature process may be difficult to be performed depending on TFT materials, and thus, an alternative element such as an oxide TFT may be used for a large-area substrate.

As such, according to an example embodiment, a drive unit in a fluid self-assembly method, a display in which a high-performance drive unit is monolithically integrated into a micro light emitting unit may be manufactured by transferring a micro display element including a micro light emitting unit and a drive unit in a fluidic self-assembly method. In this case, a display may be manufactured regardless of an area and a type of a substrate thereof, and thus, displays of various form factors may be manufactured.

Figure 18:
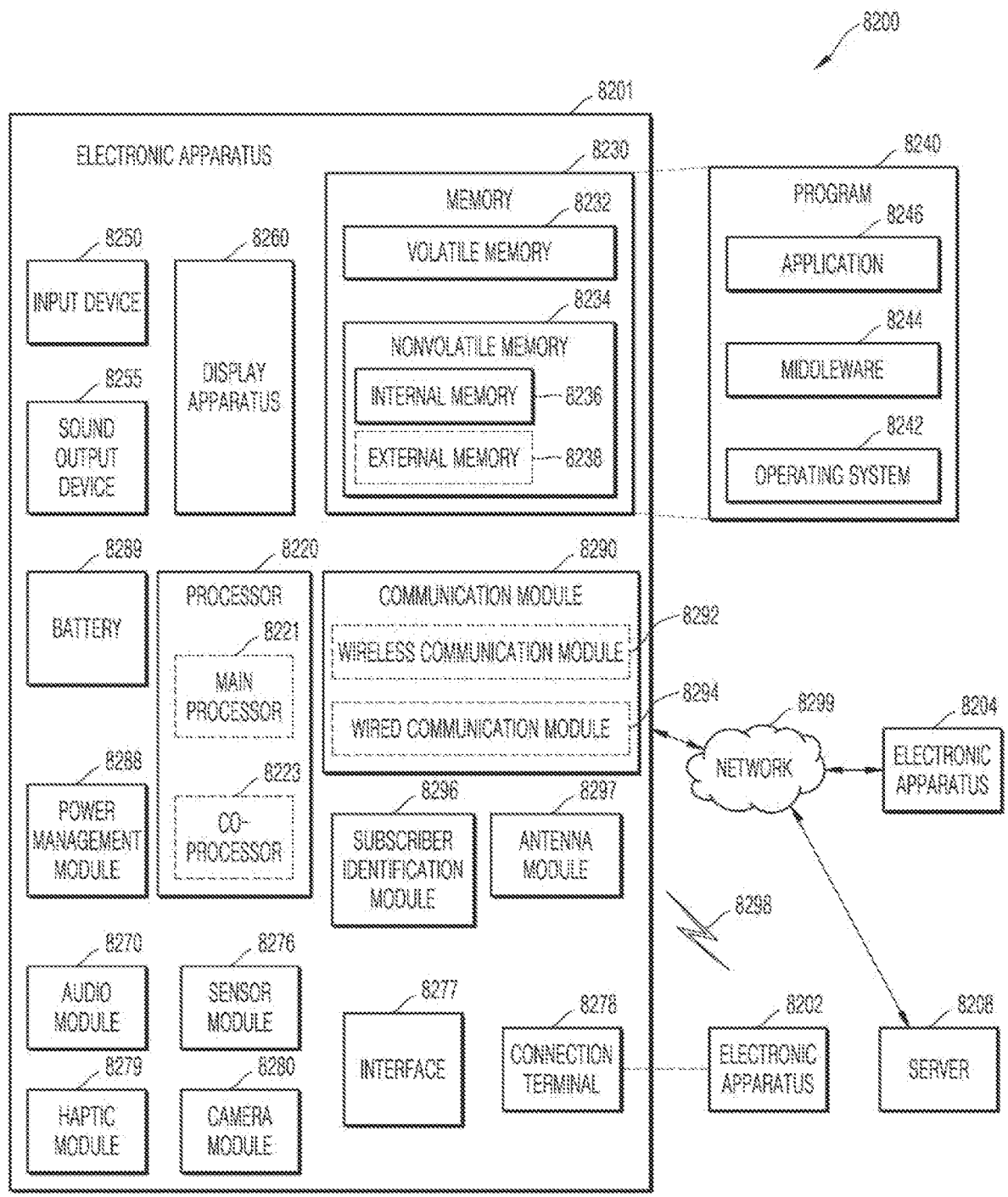
FIG. 18 is a schematic block diagram of an electronic apparatus according to an example embodiment.

FIG. 18 is a block diagram of an electronic apparatus including a display apparatus according to an example embodiment.

Referring to FIG. 18, an electronic apparatus 8201 may be provided in a network environment 8200. In the network environment 8200, the electronic apparatus 8201 may communicate with another electronic apparatus 8202 through a first network 8298 (a short-range wireless communication network or so on) or may communicate with another electronic apparatus 8204 and/or a server 8208 through a second network 8299 (a long-distance wireless communication network or so on). The electronic apparatus 8201 may communicate with the electronic apparatus 8204 through the server 8208. The electronic apparatus 8201 may include a processor 8220, a memory 8230, an input device 8250, a sound output device 8255, a display apparatus 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. Some of the components may be omitted from the electronic apparatus 8201, or other components may be added to the electronic apparatus 8201. Some of the components may be integrated in one circuit. For example, the sensor module 8276 (a fingerprint sensor, an iris sensor, an illuminance sensor, or so on) may be embedded in the display apparatus 8260 (a display or so on).

The processor 8220 may execute software (such as a program 8240) to control one or a plurality of other components (hardware, software components, and so on) of the electronic apparatus 8201 connected to the processor 8220 and may perform various data processing or arithmetic. The processor 8220 stores commands and/or data received from other components (the sensor module 8276, the communication module 8290, and so on) in a volatile memory 8232 and process the commands and/or the data stored in the volatile memory 8232 and store resulting data in a non-volatile memory 8234 as part of data processing or arithmetic. The processor 8220 may include a main processor 8221 (a central processing unit, an application processor, or so on) and a co-processor 8223 (a graphics processing unit, an image signal processor, a sensor hub processor, a communication processor, or so on) that may be operated independently or together therewith. The co-processor 8223 may use less power than the main processor 8221 and may perform a specialized function.

The co-processor 8223 may control functions and/or states related to some components (the display apparatus 8260, the sensor module 8276, the communication module 8290, and so on) of the electronic apparatus 8201 on behalf of the main processor 8221 while the main processor 8221 is in an inactive state (sleep state), or together with the main processor 8221 while the main processor 8221 is in an active state (the application execution state). The co-processor 8223 (an image signal processor, a communication processor, or so on) may be implemented as part of another component (the camera module 8280, the communication module 8290, or so on) functionally related thereto.

The memory 8230 may store various data required by components (the processor 8220, the sensor module 8276, and so on) of the electronic apparatus 8201. Data may include, for example, input data and/or output data for software (such as the program 8240) and commands related thereto. The memory 8230 may include the volatile memory 8232 and/or the non-volatile memory 8234.

The program 8240 may be stored as software in the memory 8230 and may include an operating system 8242, middleware 8244, and/or an application 8246.

The input device 8250 may receive commands and/or data to be used in components (the processor 8220 and so on) of the electronic apparatus 8201 from an exterior (a user or so on) of the electronic apparatus 8201. The input device 8250 may include a remote controller, a microphone, a mouse, a keyboard, and/or a digital pen (a stylus pen or so on).

The sound output device 8255 may output a sound signal to the exterior of the electronic apparatus 8201. The sound output device 8255 may include a speaker and/or a receiver. The speaker may be used for general purposes such as multimedia playback or recording playback, and the receiver may be used to receive incoming calls. The receiver may be integrated in the speaker as part of the speaker or may be implemented as an independent separate device.

The display apparatus 8260 may visually provide information to the exterior of the electronic apparatus 8201. The display apparatus 8260 may include a control circuit for controlling a display, a hologram apparatus, or a projector and a corresponding device. The display apparatus 8260 may include the display apparatus described with reference to FIGS. 1 to 13 and may be manufactured by the manufacturing method described with reference to FIGS. 14 to 17. The display apparatus 8260 may include touch circuitry configured to sense a touch, and/or sensor circuitry configured to measure the intensity of force generated by the touch (a pressure sensor or so on).

The audio module 8270 may convert audio into an electrical signal or may convert an electrical signal into audio. The audio module 8270 may acquire audio through the input device 8250 or may output audio through a speaker and/or a headphone of the sound output device 8255, and/or another electronic apparatus (the electronic apparatus 8202) directly or wirelessly connected to the electronic apparatus 8201.

The sensor module 8276 may detect an operation state (power, temperature, and so on) of the electronic apparatus 8201 or an external environmental state (user state or so on) and may generate an electrical signal and/or a data value corresponding to the detected state. The sensor module 8276 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more designated protocols that may be used for the electronic apparatus 8201 to be connected directly or wirelessly to another electronic apparatus (the electronic apparatus 8202 or so on). The interface 8277 may include a high-definition multimedia interface (HDMI), a Universal Serial Bus (USB) interface, a secure digital (SD) card interface, and/or an audio interface.

A connection terminal 8278 may include a connector through which the electronic apparatus 8201 may be physically connected to another electronic apparatus (for example, the electronic apparatus 8202). The connection terminal 8278 may include an HDMI connector, a USB connector, an SD card connector, and/or an audio connector (a headphone connector or so on).

The haptic module 8279 may convert an electrical signal into a mechanical stimulus (vibration, movement, or so on) or an electrical stimulus that a user may perceive through a tactile or motor sense. The haptic module 8279 may include a motor, a piezoelectric element, and/or an electrical stimulation element.

The camera module 8280 may capture a still image and a video. The camera module 8280 may include a lens assembly including one or more lenses, image sensors, image signal processors, and/or flashes. The lens assembly included in the camera module 8280 may collect light emitted from a subject to be imaged.

The power management module 8288 may manage power supplied to the electronic apparatus 8201. The power management module 8288 may be implemented as part of a power management integrated circuit (PMIC).

The battery 8289 may supply power to configuration elements of the electronic apparatus 8201. The battery 8289 may include a non-rechargeable primary cell, a rechargeable secondary cell, and/or a fuel cell.

The communication module 8290 may establish a direct (wired) communication channel and/or a wireless communication channel between the electronic apparatus 8201 and another electronic apparatus (the electronic apparatus 8202, the electronic apparatus 8204, the server 8208, or so on), and may support communication through the established communication channel. The communication module 8290 may operate independently of the processor 8220 (application processor or so on) and may include one or more communication processors that support direct communication and/or wireless communication. The communication module 8290 may include a wireless communication module 8292 (a cellular communication module, a short-range wireless communication module, a global navigation satellite system (GNSS) communication module, or so on) and/or a wired communication module 8294 (a Local Area Network (LAN) communication module, a power line communication module, or so on). A corresponding communication module among these communication modules may communicate with another electronic apparatus through the first network 8298 (a short-range communication network such as Bluetooth, WiFi Direct, or infrared data association (IrDA)) or the second network 8299 (a telecommunication network such as a cellular network, the Internet, or a computer network (a LAN, a wide area network (WAN), or so on)). Various types of these communication modules may be integrated into one configuration element (a single chip or so on) or may be implemented as a plurality of separate configuration elements (multiple chips). The wireless communication module 8292 may check and authenticate the electronic apparatus 8201 in a communication network such as the first network 8298 and/or the second network 8299 by using subscriber information (international mobile subscriber identifier (IMSI) and so on) stored in the subscriber identification module 8296.

The antenna module 8297 may transmit a signal and/or power to the outside (other electronic apparatuses or so on) or may receive a signal from the outside. An antenna may include a radiator made of a conductive pattern formed on a substrate (a printed circuit board (PCB) or so on). The antenna module 8297 may include one or a plurality of antennas. When a plurality of antennas are included, an antenna suitable for a communication method used in a communication network such as the first network 8298 and/or the second network 8299 may be selected from among the plurality of antennas by the communication module 8290. A signal and/or power may be transmitted or received between the communication module 8290 and other electronic apparatuses through the selected antenna. In addition to the antenna, other components (a radio frequency integrated circuit (RFIC) and so on) may be included as some of the antenna module 8297.

Some of the configuration elements may be connected to each other through a communication method (bus, general purpose input and output (GPIO), serial peripheral interface (SPI), mobile industry processor interface (MIPI), or so on) between peripheral devices and may interchange signals (commands, data, and so on).

A command or data may be transmitted or received between the electronic apparatus 8201 and the electronic apparatus 8204, which is external, through the server 8208 connected to the second network 8299. The other electronic apparatuses 8202 and 8204 may be the same apparatuses as or different types of apparatuses from the electronic apparatus 8201. All or some of operations performed by the electronic apparatus 8201 may be performed by one or more of the other electronic apparatuses 8202, 8204, and 8208. For example, when the electronic apparatus 8201 needs to perform a function or service, the electronic apparatus may request one or more other electronic apparatuses to perform the function or part or all of the service, instead of performing the function or service by itself. One or more other electronic apparatuses that receive a request may perform an additional function or service related to the request and may transmit a performance result to the electronic apparatus 8201. To this end, a cloud computing technology, a distributed computing technology, and/or a client-server computing technology may be used.

Figure 19:
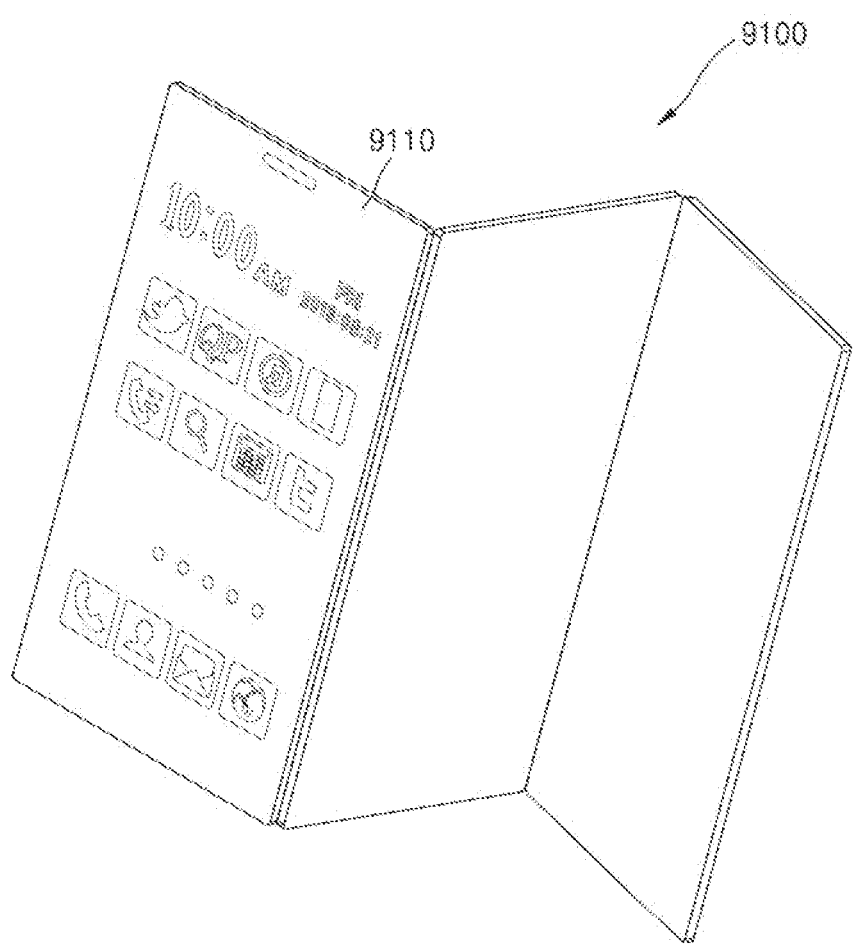
FIG. 19 illustrates an example in which a display apparatus according to an example embodiment is applied to a mobile apparatus.

FIG. 19 illustrates an example in which the electronic apparatus according to an example embodiment is applied to a mobile apparatus. The mobile apparatus 9100 may include a display apparatus 9110, and the display apparatus 9110 may include the display apparatuses described with reference to FIGS. 1 to 13. The display apparatus 9110 may have a foldable structure, for example, a multi-foldable structure.

Figure 20:
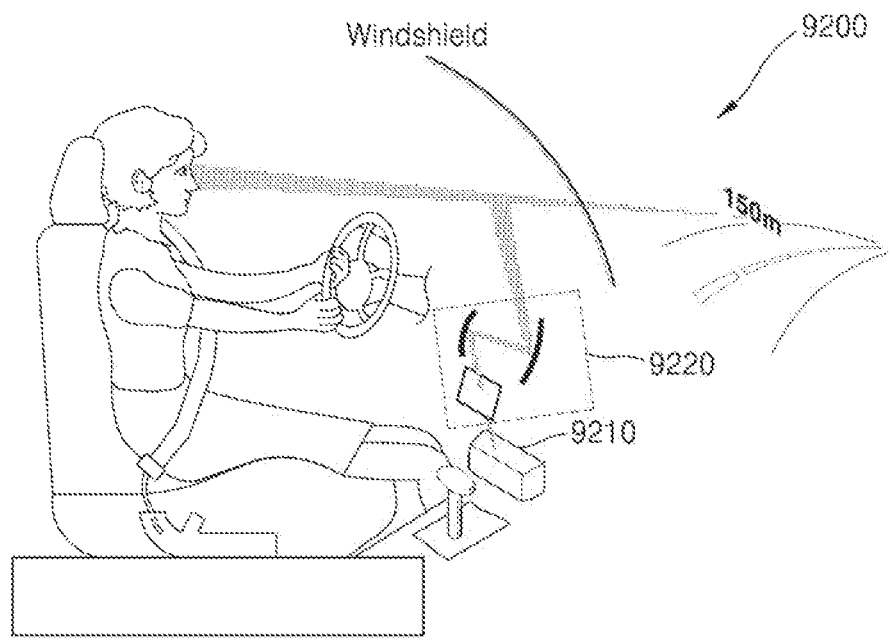
FIG. 20 illustrates an example in which a display apparatus according to an example embodiment is applied to a vehicle display apparatus.

FIG. 20 illustrates an example in which the display apparatus according to an example embodiment is applied to a vehicle. The display apparatus may include a head-up display apparatus 9200 for a vehicle and may include a display 9210 provided in one region of the vehicle and a light path modification member 9220 that converts a light path such that a driver may see an image generated by the display 9210.

Figure 21:
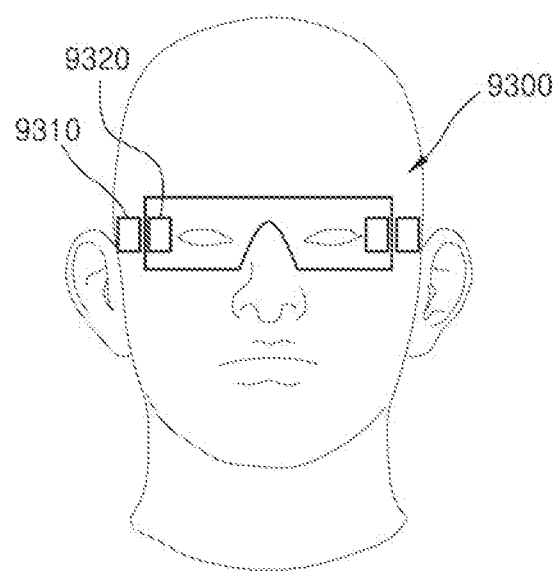
FIG. 21 illustrates an example in which a display apparatus according to an example embodiment is applied to augmented reality glasses.

FIG. 21 illustrates an example in which the display apparatus according to an example embodiment is applied to augmented reality glasses or virtual reality glasses. An augmented reality glasses 9300 may include a projection system 9310 that forms an image, and an element 9320 that guides the image from the projection system 9310 into a user's eye. The projection system 9310 may include the display apparatuses described with reference to FIGS. 1 to 13.

Figure 22:
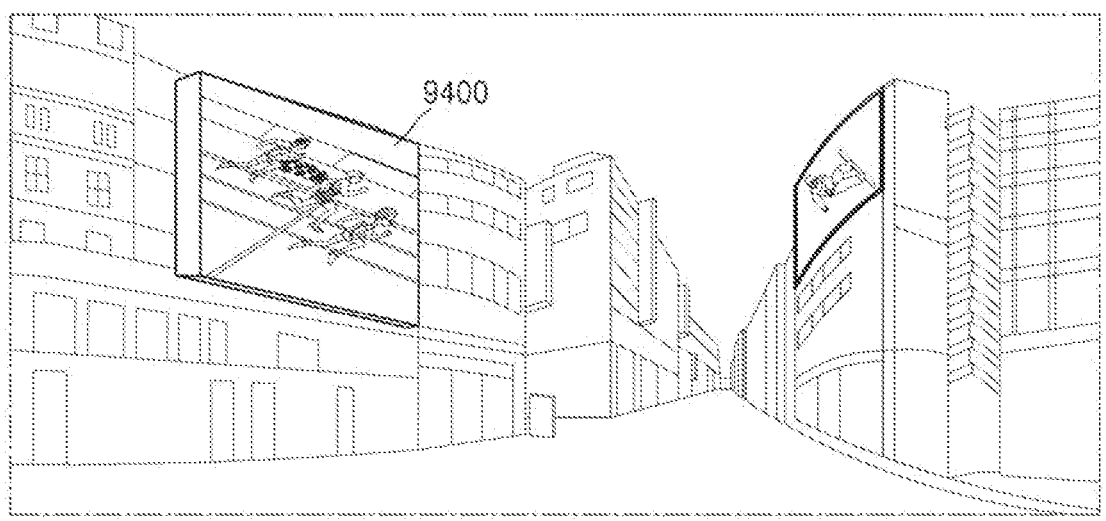
FIG. 22 illustrates an example in which a display apparatus according to an example embodiment is applied to a signage.

FIG. 22 illustrates an example in which the display apparatus according to an example embodiment is applied to a large-sized signage. A signage 9400 may be used for outdoor advertisement using a digital information display and may control advertisement contents and so on through a communication network. The signage 9400 may be implemented through, for example, the electronic apparatus described with reference to FIG. 18.

Figure 23:
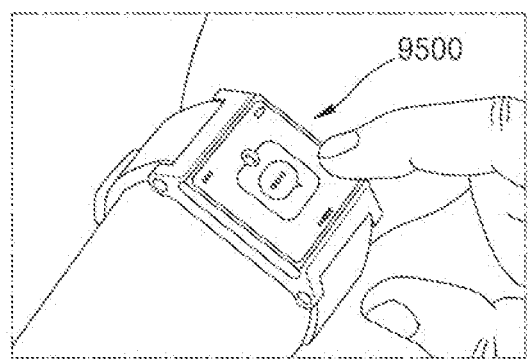
FIG. 23 illustrates an example in which a display apparatus according to an example embodiment is applied to a wearable display.

FIG. 23 illustrates an example in which the display apparatus according to an example embodiment is applied to a wearable display. A wearable display 9500 may include the display apparatuses described with reference to FIGS. 1 to 13 and may be implemented by the electronic apparatuses described with reference to FIG. 18.

A display apparatus according to the example embodiments may be applied to various products such as a rollable TV and a stretchable display.

A display apparatus according to the example embodiments may include a micro light emitting element in which a drive unit including drive electrodes is integrally provided in a micro light emitting unit, and thus, a high-performance and large-area display apparatus may be provided without limitation of a substrate for manufacturing the drive unit.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
 a transfer substrate comprising grooves; and
 micro display elements divided in units of sub-pixels, respectively provided in the grooves, and respectively spaced apart and separated from each other on the transfer substrate,
 wherein each of the micro display elements comprises a micro light emitting unit contacting a surface of a respective groove and a drive unit which faces the micro light emitting unit and is spaced apart from the surface of the respective groove, and
 wherein the drive unit comprises drive electrodes and is configured to drive the micro light emitting unit.

2. The display apparatus of claim 1, wherein the drive unit is monolithically coupled to the micro light emitting unit.

3. The display apparatus of claim 1, wherein a width of the drive unit is the same as a width of the micro light emitting unit.

4. The display apparatus of claim 1, wherein each of the micro display elements further comprises an insulating layer provided between the micro light emitting unit and the drive unit and divided in the units of the sub-pixels.

5. The display apparatus of claim 1, wherein the drive electrodes are provided at different distances from a center of the drive unit.

6. The display apparatus of claim 1, wherein the drive unit further comprises a first quadrant, a second quadrant, a third quadrant, and a fourth quadrant that are partitioned by a first axis passing through a center of the drive unit and a second axis passing through the center of the drive unit and perpendicular to the first axis, and
 wherein the drive electrodes are respectively provided in the first quadrant, the second quadrant, the third quadrant, and the fourth quadrant.

7. The display apparatus of claim 2, wherein the drive electrodes are provided at different distances from the center of the drive unit.

8. The display apparatus of claim 1, wherein the drive electrodes are symmetrically arranged with respect to a first axis passing through a center of the drive unit and a second axis passing through the center of the drive unit and perpendicular to the first axis.

9. The display apparatus of claim 1, wherein each of the drive electrodes comprises any one of a concentric circle structure, a concentric quadrangular structure, a concentric hexagonal structure, a four-divided concentric circle structure, a four-divided concentric quadrangular structure, a four-divided concentric hexagonal structure, and a six-divided concentric hexagonal structure.

10. The display apparatus of claim 1, wherein the drive unit comprises at least two transistors and at least one capacitor.

11. The display apparatus of claim 1, wherein the micro light emitting unit comprises electrodes, and
wherein the micro light emitting unit has a horizontal electrode structure in which the electrodes are arranged in one direction.

12. The display apparatus of claim 1, wherein each of the micro display elements has an asymmetric structure, and the drive electrodes included in each of the micro display elements are arranged side by side.

13. The display apparatus of claim 1, wherein each of the micro display elements further comprises a reflective layer provided between the micro light emitting unit and the drive unit.

* * * * *